United States Patent
Suzuki et al.

(10) Patent No.: US 7,948,797 B2
(45) Date of Patent: May 24, 2011

(54) NONVOLATILE SEMICONDUCTOR MEMORY DEVICE AND METHOD FOR OPERATING THE SAME

(75) Inventors: Yuya Suzuki, Yokohama (JP); Dai Nakamura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 12/564,604

(22) Filed: Sep. 22, 2009

(65) Prior Publication Data
US 2010/0124111 A1     May 20, 2010

(30) Foreign Application Priority Data
Nov. 20, 2008   (JP) ................ P2008-296451

(51) Int. Cl.
*G11C 16/26* (2006.01)
(52) U.S. Cl. ........... 365/185.03; 365/185.17; 365/185.2; 365/185.21; 365/185.23
(58) Field of Classification Search .......... None
See application file for complete search history.

(56) References Cited

U.S. PATENT DOCUMENTS

| | | | |
|---|---|---|---|
| 6,990,018 B2 * | 1/2006 | Tanaka et al. | 365/185.09 |
| 7,259,992 B2 | 8/2007 | Shirota | |
| 7,352,628 B2 * | 4/2008 | Kamei | 365/185.2 |

FOREIGN PATENT DOCUMENTS

| | | |
|---|---|---|
| JP | 2005-339692 | 12/2005 |
| JP | 2006-500727 | 1/2006 |
| WO | WO 2004/029975 A1 | 4/2004 |

OTHER PUBLICATIONS

U.S. Appl. No. 11/955,831, filed Dec. 13, 2007, Hiroshi Maejima et al.

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A nonvolatile semiconductor memory device comprises: a memory cell array including a plurality of memory cell units each including memory cells, a plurality of bit lines, and a common source line; a sense amplifier operative to read data from a selected memory cell; a control circuit operative to control a read operation of the sense amplifier; and a cell source monitoring circuit operative to detect a voltage of the common source line, compare the detected voltage of the common source line with a reference voltage, and output a read control signal. The sense amplifier is configured to read data from the selected memory cell through at least two cycles. The control circuit is configured to perform control to determine whether the data reading is to be ended after a first reading cycle or a second reading cycle is to be carried out, based on the read control signal.

20 Claims, 6 Drawing Sheets

NONVOLATILE SEMICONDUCTOR MEMORY DEVICE AND METHOD FOR OPERATING THE SAME

CROSS REFERENCE TO RELATED APPLICATIONS

This application is based on and claims the benefit of priority from prior Japanese Patent Application No. 2008-296451, filed on Nov. 20, 2008, the entire contents of which are incorporated herein by reference.

BACKGROUND OF THE INVENTION

1. Field of the Invention

The present invention relates to a nonvolatile semiconductor memory device (EEPROM) configured using electrically rewritable nonvolatile memory cells, and a method for operating the nonvolatile semiconductor memory device.

2. Description of the Related Art

A sense amplifier of a semiconductor memory such as a flash memory basically judges data stored in a memory cell by detecting existence or non-existence of a cell current or a magnitude of the cell current in accordance with the data stored in the memory cell. The sense amplifier is normally connected to a data line (or a bit line) to which a number of memory cells are connected. Sense methods implemented by such sense amplifiers are roughly divided into a voltage-detection type and a current-detection type.

A sense amplifier of a voltage-detection type precharges a bit line to a certain voltage while it is isolated from memory cells. The sense amplifier then discharges the bit line through a selected memory cell, and detects the discharge state of the bit line at a sense node connected to the bit line. At the time of data sensing, the bit line is isolated from the current source load, and the sense amplifier detects a bit line voltage that is dependent on cell data.

A sense amplifier of a current-detection type performs data sensing by supplying a read current to a memory cell via a bit line. The bit line voltage in this case is also dependent on cell data, and a data judgment at the sense node connected to the bit line is finally made by detecting the voltage difference based on the cell current difference.

The sense amplifier of a current-detection type can perform high-speed sensing by performing data sensing while supplying a read current to the memory cell via the corresponding bit line. The variation range of the bit line voltage due to cell data can be suppressed to a small value by a clamp transistor (pre-sense amplifier) that is provided between the bit line and the sense node. Accordingly, noise between bit lines can be tolerated. Thus, simultaneous read operations can be performed on all the bit lines. However, since the read operations are performed while a read current is being supplied to the memory cells, the voltage of the common source line provided in the memory cell array may rise from the ground potential.

When the voltage of the common source line varies, the cell current flowing through the selected memory cell also varies, and the data-reading accuracy of the sense amplifier becomes poorer. Therefore, in a conventional sense amplifier of a current-detection type, a read operation is divided into two cycles, so as to compensate for the decrease in the accuracy of the read operations (see Japanese National Publication No. 2006-500727). Where data is always read from a memory cell through two cycles, however, the time required for data reading becomes longer, and the sense operation cannot be performed at a higher speed.

SUMMARY OF THE INVENTION

According to an aspect of the present invention, there is provided a nonvolatile semiconductor memory device comprising: a memory cell array including a plurality of memory cell units each including memory cells connected in series, a plurality of bit lines each connected to one end of corresponding one of the memory cell units, and a common source line commonly connected to the other ends of the plurality of the memory cell units, each of the memory cells storing a first data state and a second data state that provides a smaller cell current than the first data state at the time of data reading; a sense amplifier operative to read data from a selected memory cell via the bit line; a control circuit operative to control a read operation of the sense amplifier; and a cell source monitoring circuit operative to detect a voltage of the common source line while the data is read from the selected memory cell, compare the detected voltage of the common source line with a reference voltage, and output a read control signal, the sense amplifier being configured to be capable of reading data from the selected memory cell through at least two cycles including a first reading cycle and a second reading cycle, the second reading cycle being to be carried out after the first reading cycle, and the control circuit being configured to perform control to determine whether the data reading is to be ended after the first reading cycle or the second reading cycle is to be carried out, based on the read control signal.

According to another aspect of the present invention, there is provided a nonvolatile semiconductor memory device comprising: a memory cell array including a plurality of memory cell units each including memory cells connected in series, a plurality of bit lines each connected to one end of corresponding one of the memory cell units, and a common source line commonly connected to the other ends of the plurality of the memory cell units, each of the memory cells storing a first data state and a second data state that provides a smaller cell current than the first data state at the time of data reading; a sense amplifier operative to read data from a selected memory cell via the bit line; a control circuit operative to control a read operation of the sense amplifier; and a common source line driver operative to set a voltage of the common source line at a certain potential, the sense amplifier being configured to be capable of reading data from the selected memory cell through at least two cycles including a first reading cycle and a second reading cycle, the second reading cycle being to be carried out after the first reading cycle, and the control circuit being configured to perform the second reading cycle when data is read from the selected memory cell separated from the common source line driver in the memory cell array by a certain distance or more, whereas finishes data reading after the first reading cycle is completed when data is read from the selected memory cell located at a position closer to the common source line driver than the certain distance.

According to an aspect of the present invention, there is provided a method for operating a nonvolatile semiconductor memory device including a sense amplifier configured to read data from a selected memory cell through at least two cycles including a first reading cycle and a second reading cycle, the second reading cycle being to be carried out after the first reading cycle, the method comprising: reading, by the sense amplifier, data from a selected memory cell via a bit line connected to one end of a memory cell unit, the memory cell unit including memory cells connected in series, each of the memory cells storing a first data state and a second data state that provides a smaller cell current than the first data state at the time of data reading; detecting, by a cell source monitoring circuit, a voltage of a common source line commonly connected to the other ends of the plurality of the memory cell units while data is being read from the selected memory cell; outputting, by the cell source monitoring circuit, a read control signal after comparing the detected voltage of the common source line with a reference voltage; and determining, in a control circuit, whether the data read operation of the sense amplifier is to be ended after the first reading cycle is completed, or the second reading cycle is to be carried out, based on the read control signal.

DETAILED DESCRIPTION OF THE EMBODIMENTS

Embodiments of the present invention will be described hereinafter with reference to the accompanying drawings.

First Embodiment

Figure 1:
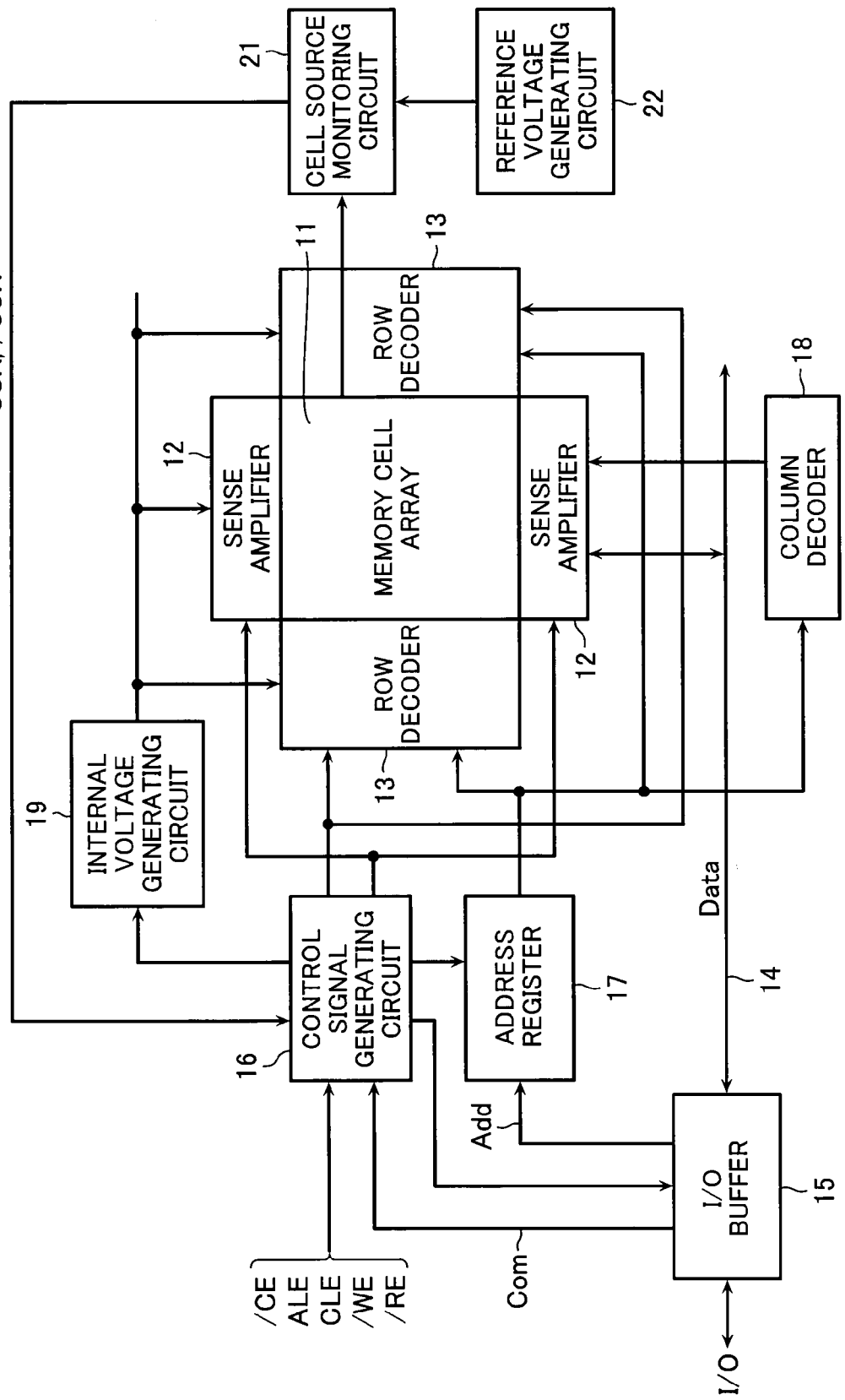
FIG. 1 is a block diagram showing a configuration of a NAND flash memory according to a first embodiment.
Figure 2:
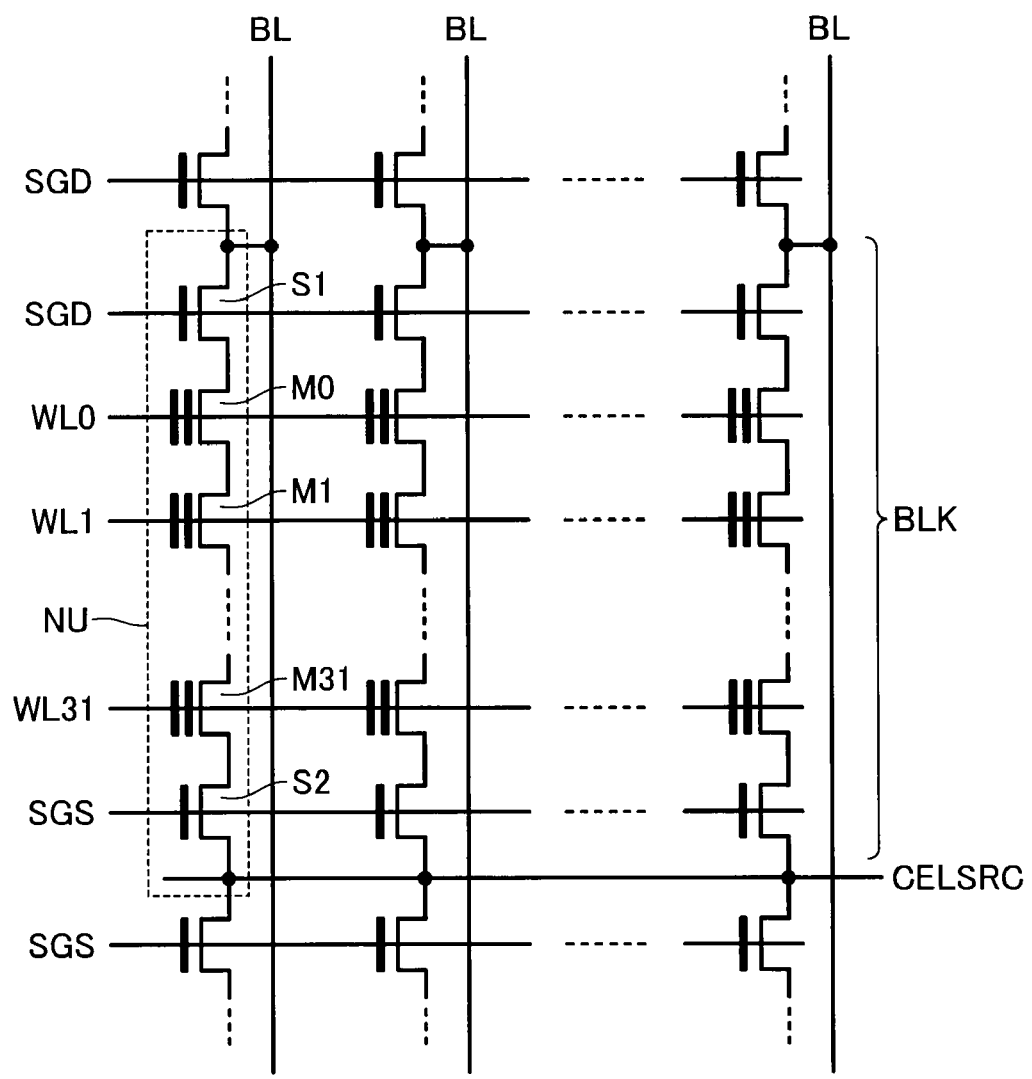
FIG. 2 is an equivalent circuit diagram showing a memory cell array of the NAND flash memory according to the first embodiment.

Structure of Nonvolatile Semiconductor Memory Device According to First Embodiment FIG. 1 is a block diagram showing a configuration of a NAND flash memory according to a first embodiment. FIG. 2 is an equivalent circuit diagram of a memory cell array of the NAND flash memory according to the first embodiment.

As shown in FIG. 2, a memory cell array 11 is formed with NAND cell units NU arranged in a matrix form. Each of the NAND cell units NU includes a plurality of nonvolatile memory cells M0 through M31 (thirty-two memory cells in the example shown in FIG. 2) that are connected in series and are electrically rewritable, and select gate transistors S1 and S2 that connect the both ends of the memory cells to a bit line BL and a common source line CELSRC, respectively. Here, each of the memory cells has a stacked gate structure that has a gate insulating film, a floating gate electrode, an intergate insulating film, and a control gate electrode stacked on a p-type well formed on a semiconductor substrate.

The control gates of the memory cells in each NAND cell unit NU are connected to different word lines WL0 through WL31. The gates of the select gate transistors S1 and S2 are connected to select gate lines SGD and SGS, respectively. A group of NAND cell units NU sharing word lines forms a block that serves as a data erase unit. As shown in FIG. 2, a plurality of blocks BLK are arranged in the bit line direction.

Each of the bit lines BL is connected to the later-described sense amplifier 12. The memory cells connected to one word line WL form one page.

As shown in FIG. 1, the sense amplifier 12 is placed in the bit line direction of the memory cell array 11. The sense amplifier 12 is connected to the bit lines BL, and performs data reading on a page basis. The sense amplifier 12 also serves as a data latch that holds one-page write data. Accordingly, reading and writing are performed on a page basis. The sense amplifier 12 is of a current-detection type that can read data from a plurality of selected memory cells via all the bit lines BL in a block BLK. The sense amplifier 12 is accompanied by a data cache that temporarily stores input/output data, and a column select gate circuit that performs column selection.

A row decoder 13 is placed in the word line direction of the memory cell array 11, and selectively drives the word lines WL and the select gate lines SGD and SGS in accordance with a row address. The row decoder 13 includes a word line driver and a select gate line driver. A column decoder 18 that controls the column select gate circuit in the sense amplifier 12 also included in the sense amplifier 12. The row decoder 13, the column decoder 18, and the sense amplifier 12 form a read/write circuit that performs data reading and writing on the memory cell array 11.

Data transfers are performed by an input/output buffer 15 and a data line 14 between an external input/output port I/O and the sense amplifier 12. More specifically, page data that is read by the sense amplifier 12 is output to the data line 14, and is further output to the input/output port I/O via the input/output buffer 15. Write data that is supplied from the input/output port I/O is loaded into the sense amplifier 12 via the input/output buffer 15.

Address data Add that is supplied from the input/output port I/O is supplied to the row decoder 13 and the column decoder 18 via an address register 17. Command data Com that is supplied from the input/output port I/O is decoded and is set in a control signal generating circuit 16.

External control signals including a chip enable signal /CE, an address latch enable signal ALE, a command latch enable signal CLE, a write enable signal /WE, and a read enable signal /RE are supplied to the control signal generating circuit 16. Based on the command Com and the external control signal, the control signal generating circuit 16 controls the operation of an entire memory operation, and controls an internal voltage generating circuit 19 to generate various internal voltages required for data reading, writing and erasing.

A cell source monitoring circuit 21 compares and amplifies a voltage (a cell source voltage Vcs) of the common source lines CELSRC of the memory cell array and a reference voltage Vref generated from a reference voltage generating circuit 22 when data reading is performed. If the detected cell source voltage Vcs is equal to or higher than the reference voltage Vref, the cell source monitoring circuit 21 outputs a read control signal CSR to the control signal generating circuit 16, to perform a second read operation on the memory cell array. If the detected cell source voltage Vcs is lower than the reference voltage Vref, the cell source monitoring circuit 21 outputs a read control signal /CSR to the control signal generating circuit 16, so as not to perform (stop performing) the second read operation. Based on the read control signal CSR or /CSR, the control signal generating circuit 16 controls the read operation by the sense amplifier 12 and the row decoder 13.

(Operation of Nonvolatile Semiconductor Memory Device According to First Embodiment)

Figure 3:
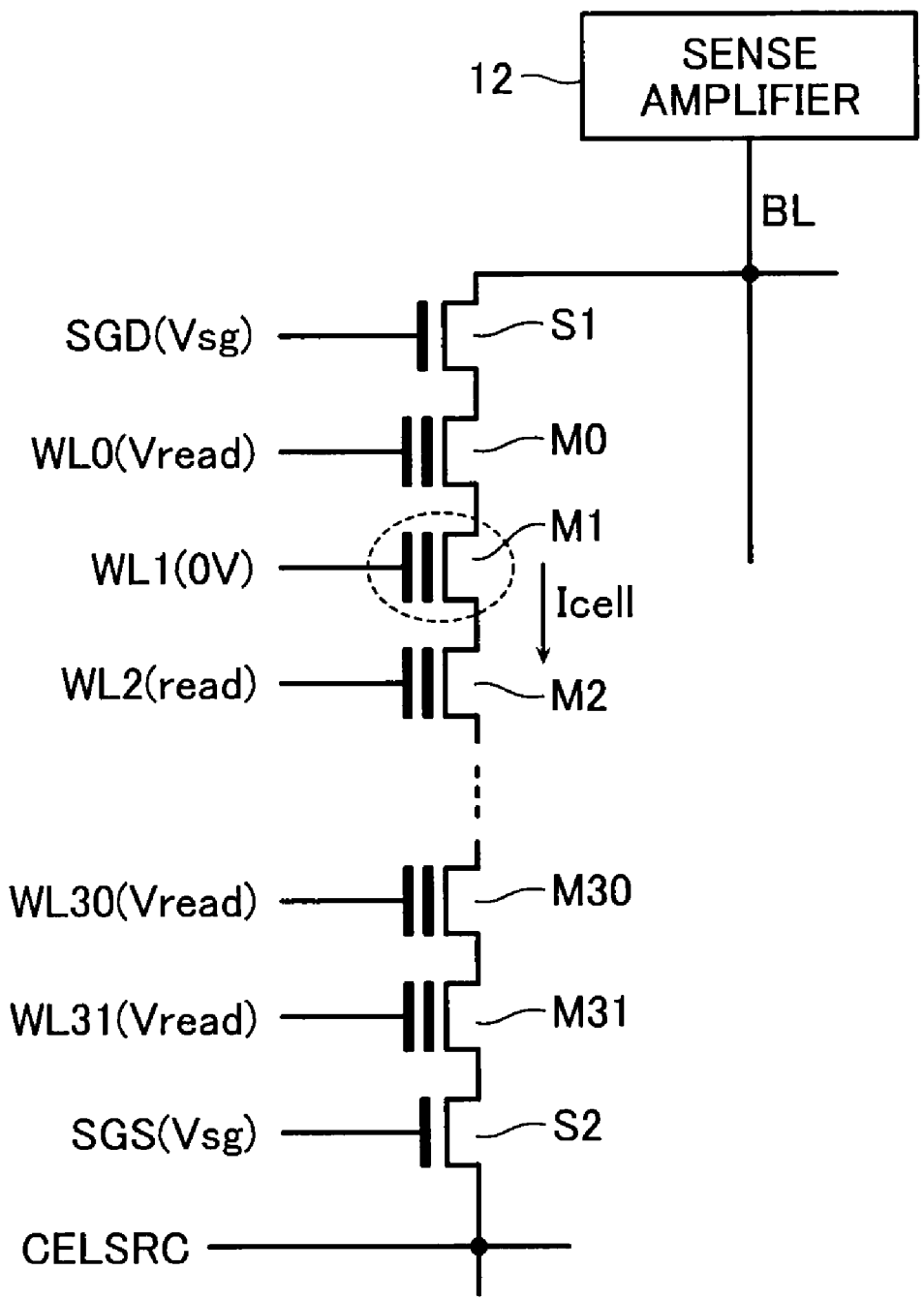
FIG. 3 illustrates states of a current flowing through a NAND cell unit NU and a voltage applied to the NAND cell unit NU in a data read operation.
Figure 4:
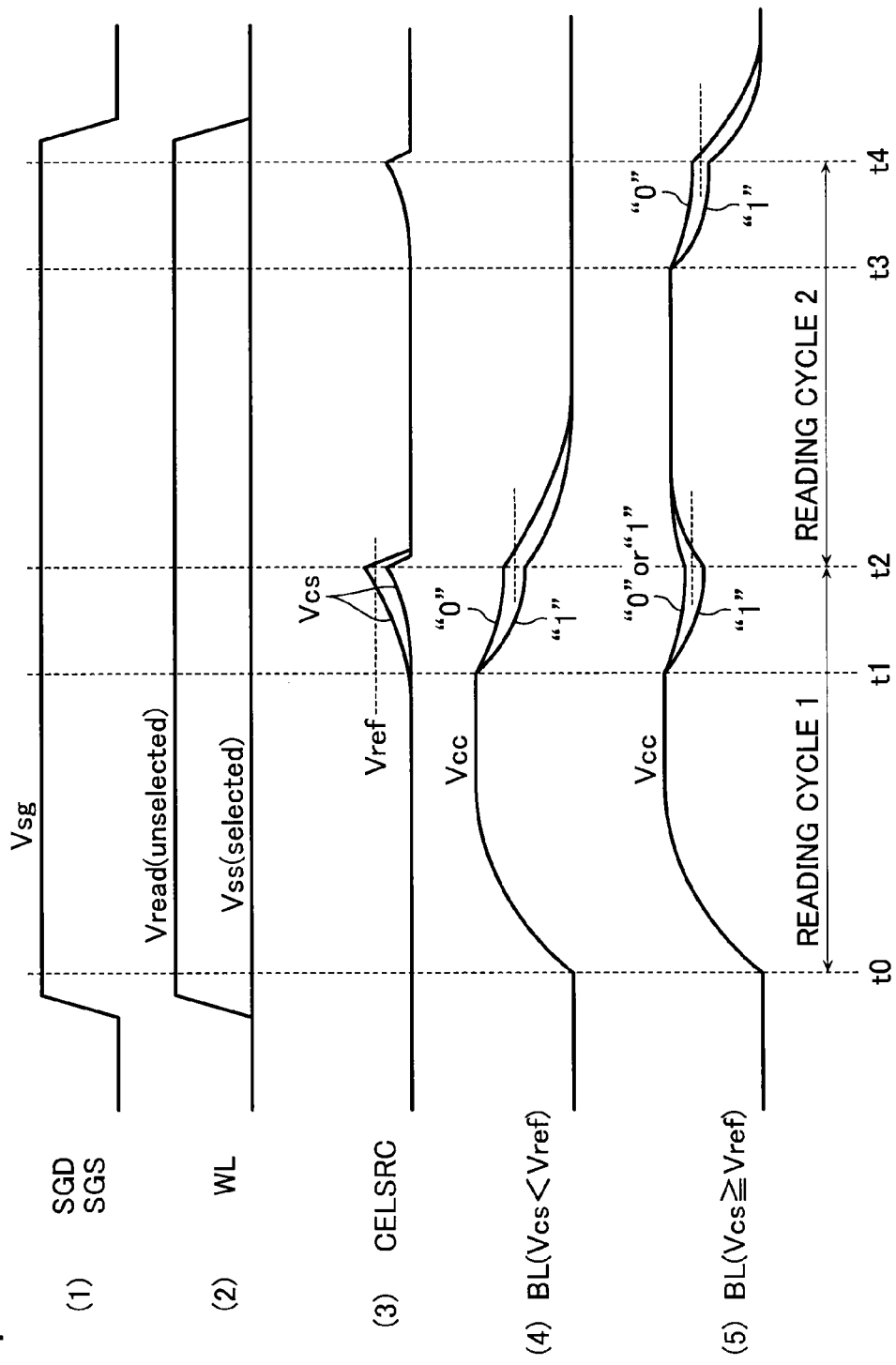
FIG. 4 is a timing chart illustrating a data read operation of the NAND flash memory according to the first embodiment.
Figure 5:
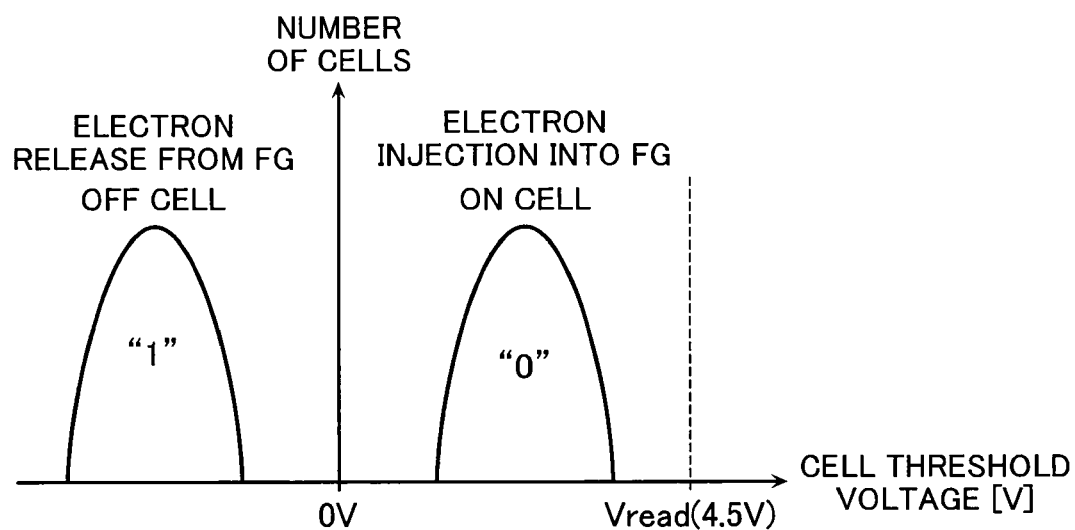
FIG. 5 shows the data threshold value distribution of the NAND flash memory according to the first embodiment.

Next, a data read operation of the NAND flash memory according to this embodiment will be described, with reference to the accompanying drawings. FIG. 3 illustrates states of a current flowing through the NAND cell unit NU and a voltage applied to the NAND cell unit NU in a data read operation. FIG. 4 is a timing chart illustrating the data read operation of the NAND flash memory of this embodiment. FIG. 5 shows the data threshold value distribution of the NAND flash memory of this embodiment.

Where the NAND flash memory of this embodiment stores binary data, the threshold voltage distribution of the data is the distribution shown in FIG. 5. A first data state is a state in which the threshold voltage has a negative value or "1" data (an erased state). A second data state is a state in which the threshold voltage has a positive value or "0" data.

Data erasing and writing in the NAND flash memory will be briefly described in the following. Data erasing is performed on a block BLK basis, with the block BLK being defined as a set of NAND cell units NU sharing word lines. A voltage of 0 V is applied to all the word lines WL of a selected block BLK, and an erase voltage Vera (20 V, for example) is applied to the p-type well on which the memory cell array 11 is formed. In this manner, the electrons in the floating gates of all the cells are released to the channel, and the data state is put into the "1" data state with the lower threshold value.

Data writing is performed on a page basis, with a page being defined as a set of memory cells sharing one word line. In a write operation, a voltage Vcc (in the case of "1" data) or a voltage Vss (in the case of "0" data") is applied to the NAND cell channel via a bit line, in accordance with the data. When a write voltage Vpgm (20 V, for example) is applied to the word lines WL of the selected page, and a write pass voltage Vpass (a voltage to make the memory cells conductive, regardless of the data) is applied to the unselected word lines WL, electrons are injected from the channel into the floating gates of the memory cells having the "0" data supplied thereto, by FN tunneling. In the memory cells having the "1" data supplied thereto, the channel potential becomes higher, and no electrons are injected into the floating gate.

Referring now to FIGS. 3 and 4, a data read operation in the NAND flash memory of this embodiment will be described. The data read operation is also performed on a page basis.

During the read operation illustrated in FIG. 4, a read voltage Vss (0 V, for example) is applied to the selected word line WL in a selected block BLK in the memory cell array 11, and a read pass voltage Vread (4.5 V, for example) that makes memory cells conductive regardless of the data stored therein is applied to the unselected word lines WL. The relationships between these voltages and the data threshold value distribution are shown in FIG. 5. A read pass voltage Vsg is applied to the select gate lines SGD and SGS.

At time t0, a current is supplied to a selected bit line BL, and first-cycle data reading is started. Here, the selected bit line is charged up to the voltage Vcc, for example.

At time t1, a sense operation by the sense amplifier 12 is started. During the period between time t1 and time t2, if the cell data of a selected memory cell M1 is "0", the memory cell M1 does not become conductive with the selected word line voltage Vss (=0 V), and a cell current Icell does not flow. Therefore, the selected bit line voltage is maintained at a high value. If the cell data of the selected memory cell M1 is "1", the memory cell M1 becomes conductive with the selected word line voltage Vss (=0 V), and the cell current Icell flows. Also, the bit lines voltage becomes lower. The change in the bit line voltage is sensed by the sense amplifier 12, and the cell data of the selected memory cell M1, which is the "0" data or the "1" data, is read.

Here, the cell current Icell flows into the common source line CELSRC connected to a plurality of NAND cell units NU, via selected memory cells having the "1" data. Because of the cell current Icell, the cell source voltage Vcs of the common source line CELSRC may rise (be lifted up) at the time of data reading from memory cells. If the cell source voltage Vcs of the common source line CELSRC is equal to or higher than the reference voltage Vref (Vcs≧Vref), the cell current Icell hardly flows, and the voltage of the selected bit line BL may not become low enough, though the selected memory cell M1 has the "1" data and is conductive. In such a case, the voltage of the selected bit line BL is maintained at a high value, and a check cannot be made to determine whether the data held by the selected memory cell is the "0" data or the "1" data.

In the NAND flash memory according to this embodiment, the voltage of the common source line CELSRC is detected by the cell source monitoring circuit 21, and is compared with the reference voltage Vref. If the cell source voltage Vcs is lower than the reference voltage Vref in the first reading cycle 1 (Vcs<Vref), the data read operation is ended (as indicated by the waveform (4) in FIG. 4). If the cell source voltage Vcs is equal to or higher than the reference voltage Vref in the first reading cycle 1 (Vcs≧Vref), there is a possibility that an accurate check cannot be made to determine whether the data is the "0" data or the "1" data in the first reading cycle 1. Therefore, the following reading cycle 2 is performed (as indicated by the waveform (5) in FIG. 4).

FIG. 4 shows the waveform (4) of the data read operation to be performed via a bit line when the cell source voltage Vcs is lower than the reference voltage Vref, and the waveform (5) of the data read operation to be performed when the cell source voltage Vcs is equal to or higher than the reference voltage Vref.

More specifically, when the cell source voltage Vcs is equal to or higher than the reference voltage Vref (Vcs≧Vref), a read operation is performed at time t2, and a current is then supplied to a selected bit line BL to start a second data read operation. After the current is supplied to the bit line BL until time t3, data sensing is performed at time t4, as in the first reading cycle 1.

In the NAND flash memory of this embodiment, the select gate transistors S1 and S2 may be configured to turn off in the second reading cycle, and the read current may not be supplied to the NAND cell unit NU containing a cell from which the "1" data is read in the first reading cycle. Since the cell source voltage Vcs of the common source line CELSRC can be prevented from rising from the ground potential Vss, the possibility of erroneous reading becomes lower. In this manner, the data of the selected cell can be certainly detected in the second reading cycle 2 with higher sensitivity.

(Advantages of Nonvolatile Semiconductor Memory Device According to First Embodiment)

Being of a current-detection type, the sense amplifier 12 of this embodiment can perform data sensing at a higher speed than a sense amplifier of a voltage-detection type in a large-capacity flash memory having a large bit line capacitance.

Also, as shown in FIG. 4, in reading data from a selected page, control can be performed to determine whether the second reading cycle should be carried out, based on the cell source voltage Vcs of the common source line CELSRC in this embodiment. If the cell source voltage Vcs of the common source line CELSRC is lower than the reference voltage Vref in the first reading cycle 1, control is performed so as not to carry out the second reading cycle 2. In this manner, a data read operation can be performed at a higher speed than in a case where a reading cycle is always repeated twice by a current-detection type sense amplification method.

In the NAND flash memory according to this embodiment, the reference voltage Vref needs to be set at a value not higher than the cell source voltage Vcs with which accurate reading can be performed through one operation. Since the cell source voltage Vcs varies depending on an actual chip evaluation and parameters such as the timing of each control signal, the value of the reference voltage Vref may be changed with the use of ROMFUSE or the like.

Second Embodiment

Figure 6:
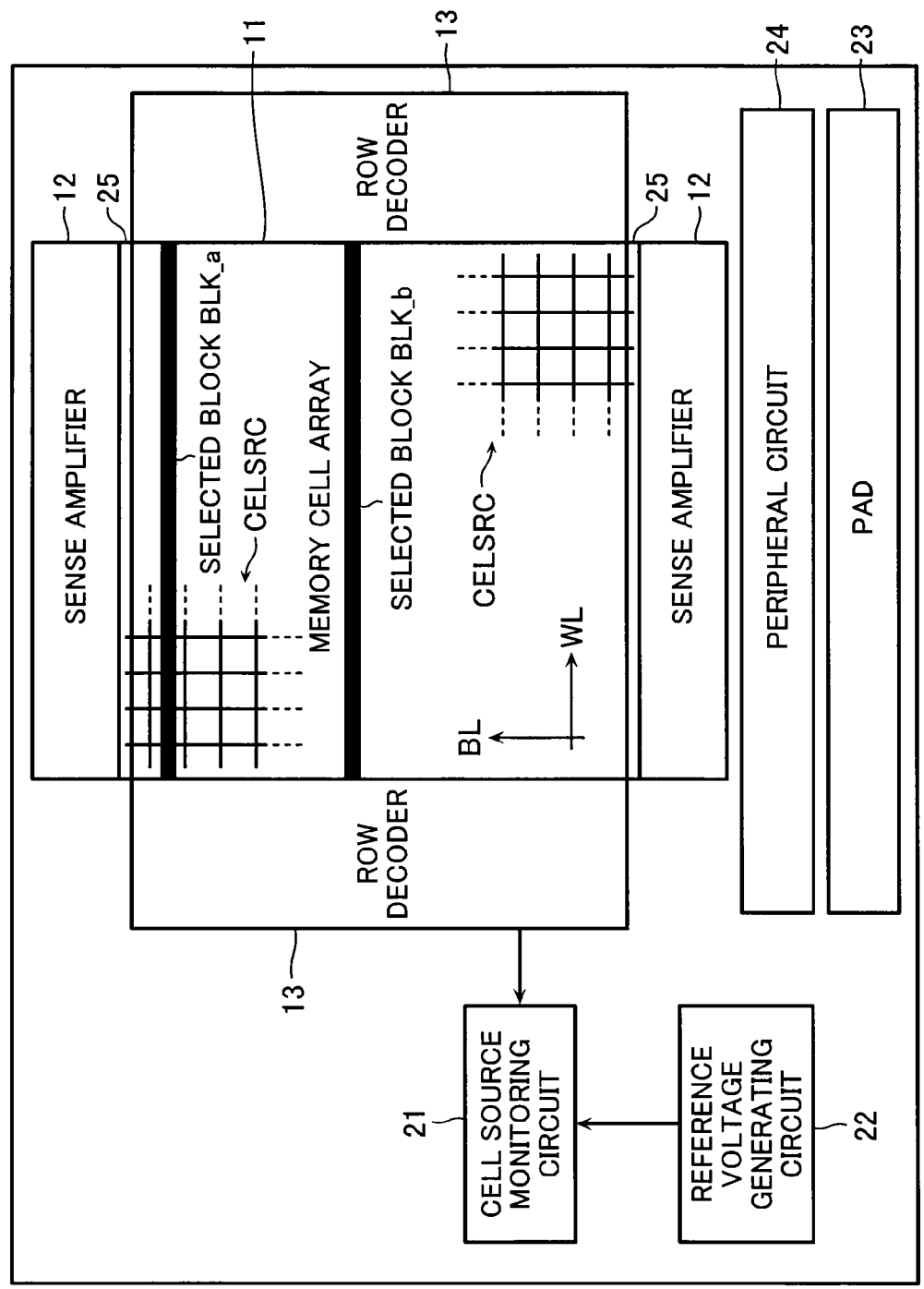
FIG. 6 illustrates a configuration of a NAND flash memory according to a second embodiment.

Structure of Nonvolatile Semiconductor Memory Device According to Second Embodiment Next, a second embodiment of the present invention will be described. FIG. 6 illustrates a configuration of a NAND flash memory according to this embodiment. The basic configurations of the memory cell array 11, the sense amplifier 12, the row decoder 13, and the like of the NAND flash memory of this embodiment are the same as those of the NAND flash memory of the first embodiment, and therefore, explanation thereof is omitted herein.

In the NAND flash memory according to this embodiment, a peripheral circuit 24 that controls entire memory operations and also controls data exchanges with other devices, and a pad 23 that serves as a power supply pad are provided. When data is read from a selected memory cell, the peripheral circuit 24 of the NAND flash memory of this embodiment can perform control to determine whether the second reading cycle should be carried out or the data read operation should be ended after the first reading cycle is completed, in accordance with the position of the selected memory cell in the memory cell array.

The NAND flash memory according to this embodiment has the common source line CELSRC that is commonly connected to the respective NAND cell units NU, as in the first embodiment. The common source line CELSRC is commonly connected to the source diffusion layers of the NAND cell units NU in the memory cell array 11 as described above, and a certain potential (the ground potential, for example) is supplied to the common source line CELSRC. The common source line CELSRC is also connected to the common source lines CELSRC of the other blocks in the wiring layer as an upper layer of the memory cell array 11. The common source line CELSRC is further connected to a common source line driver 25. The common source line driver 25 grounds the common source line CELSRC, and supplies the ground potential.

(Operation of Nonvolatile Semiconductor Memory Device According to Second Embodiment)

A read operation in the NAND flash memory according to this embodiment will be described in the following.

In the NAND flash memory of this embodiment illustrated in FIG. 6, the voltages and the like to be applied to the bit lines BL and the word lines WL in a read operation are the same as those in the first embodiment. As described above, when data is read from a selected memory cell, the peripheral circuit 24 of the NAND flash memory can perform control to determine whether the second reading cycle should be carried out or the data read operation should be ended after the first reading cycle is completed, in accordance with the position of the selected memory cell in the memory cell array.

In the memory cell array 11 shown in FIG. 6, when a block BLK_b is selected, the common source line CELSRC connected to the selected block BLK_b is separated from the common source line driver 25 by a certain distance or more. When data is read from a memory cell in the selected block BLK_b, the voltage of the common source line CELSRC is adjusted to the ground potential via the common source line driver 25. However, the voltage of the common source line CELSRC may not be completely lowered to the ground potential due to the wiring resistance of the common source line CELSRC or the like. In such a case, the potential of the common source line CELSRC rises (is lifted up) in the data read operation, and accurate data reading cannot be performed. Therefore, the peripheral circuit 24 controls the sense amplifier 12 to perform the data read operation on the selected block BLK_b up to the reading cycle 2 shown in FIG. 4.

When a block BLK_a is selected, the common source line CELSRC connected to the selected block BLK_a is located close to the common source line driver 25. Accordingly, when data is read from a memory cell in the selected block BLK_a, the voltage of the common source line CELSRC is certainly adjusted to the ground potential via the common source line driver 25. The peripheral circuit 24 then controls the sense amplifier 12 to end the data read operation on the selected block BLK_a after the reading cycle 1 shown in FIG. 4 is completed.

(Advantages of Nonvolatile Semiconductor Memory Device According to Second Embodiment)

Being of a current-detection type, the sense amplifier 12 of this embodiment can perform data sensing at a higher speed than a sense amplifier of a voltage-detection type in a large-capacity flash memory having a high bit line capacitance.

In this embodiment, when data is read from the selected block BLK_b separated from the common source line driver 25 by a certain distance in the memory cell array, the second reading cycle is carried out. When data is read from the selected block BLK_a located at a position closer to the common source line driver 25 than the certain distance, the data reading is ended after the first reading cycle is completed. Based on this, the peripheral circuit 24 performs control to determine whether the data read operation should be ended after the first data reading cycle is completed, or the second data reading cycle should be carried out. In this manner, a data read operation can be performed at a higher speed than in a case where a reading cycle is always repeated twice by a current-detection type sense amplification method.

Although the embodiments of the present invention have been described so far, the present invention is not limited to them, and various modifications and additions may be made without departing from the scope of the invention. For example, the above-described embodiments concern NAND flash memories having memory cells each storing charges in a floating gate. However, the present invention may be applied to a flash memory that includes MONOS memory cells each having a silicon oxide film, a silicon nitride film, and a silicon oxide film stacked in this order.

In the second embodiment, when the block BLK_b separated from the common source line driver 25 by a certain distance or more is selected, the second-cycle data reading is invariably performed. In the NAND flash memory according to the second embodiment, however, the cell source monitoring circuit 21 and the reference voltage generating circuit 22 of the first embodiment may be provided, and the number of reading cycles to be carried out on the block BLK_b separated from the common source line driver 25 by the certain distance or more may be controlled.

What is claimed is:

1. A nonvolatile semiconductor memory device comprising:
 a memory cell array including a plurality of memory cell units each including memory cells connected in series, a plurality of bit lines each connected to one end of corresponding one of the memory cell units, and a common source line commonly connected to the other ends of the plurality of the memory cell units, each of the memory cells storing a first data state and a second data state that provides a smaller cell current than the first data state at the time of data reading;
 a sense amplifier operative to read data from a selected memory cell via the bit line;
 a control circuit operative to control a read operation of the sense amplifier; and
 a cell source monitoring circuit operative to detect a voltage of the common source line while the data is read from the selected memory cell, compare the detected voltage of the common source line with a reference voltage, and output a read control signal,
 the sense amplifier being configured to be capable of reading data from the selected memory cell through at least two cycles including a first reading cycle and a second reading cycle, the second reading cycle being to be carried out after the first reading cycle, and
 the control circuit being configured to perform control to determine whether the data reading is to be ended after the first reading cycle or the second reading cycle is to be carried out, based on the read control signal.

2. The nonvolatile semiconductor memory device according to claim 1, further comprising a reference voltage generating circuit operative to generate the reference voltage,
 wherein the reference voltage generating circuit may change a magnitude of the reference voltage.

3. The nonvolatile semiconductor memory device according to claim 1, wherein
 a certain number of the memory cell units arranged in one direction in the memory cell array form a block, and
 the sense amplifier reads data from a plurality of selected memory cells via all the bit lines in the block.

4. The nonvolatile semiconductor memory device according to claim 1, wherein the sense amplifier performs control so as to stop supplying a read current to the selected memory cell in the second reading cycle, when the first data state is detected in the selected memory cell in the first reading cycle.

5. The nonvolatile semiconductor memory device according to claim 1, wherein the sense amplifier is a sense amplifier of a current-detection type that reads data from the selected memory cell while supplying the read current to the selected memory cell via the bit line during a data read operation.

6. The nonvolatile semiconductor memory device according to claim 1, wherein
 in the first and second reading cycles,
 a read pass voltage that makes a memory cell conductive whether the corresponding memory cell is in the first data state or the second data state is applied to each unselected word line in the memory cell array, and
 a read voltage that makes the memory cell conductive when the corresponding memory cell is in the first data state, and makes the memory cell nonconductive when the corresponding memory cell is in the second data state is applied to each selected word line in the memory cell array.

7. The nonvolatile semiconductor memory device according to claim 1, wherein each of the memory cells has a stacked gate structure that has a floating gate electrode and a control gate electrode stacked on a semiconductor substrate via an insulating film.

8. A nonvolatile semiconductor memory device comprising:
 a memory cell array including a plurality of memory cell units each including memory cells connected in series, a plurality of bit lines each connected to one end of corresponding one of the memory cell units, and a common source line commonly connected to the other ends of the plurality of the memory cell units, each of the memory cells storing a first data state and a second data state that provides a smaller cell current than the first data state at the time of data reading;
 a sense amplifier operative to read data from a selected memory cell via the bit line;
 a control circuit operative to control a read operation of the sense amplifier; and
 a common source line driver operative to set a voltage of the common source line at a certain potential,
 the sense amplifier being configured to be capable of reading data from the selected memory cell through at least two cycles including a first reading cycle and a second reading cycle, the second reading cycle being to be carried out after the first reading cycle, and
 the control circuit being configured to perform the second reading cycle when data is read from the selected memory cell separated from the common source line driver in the memory cell array by a certain distance or more, whereas finishes data reading after the first reading cycle is completed when data is read from the selected memory cell located at a position closer to the common source line driver than the certain distance.

9. The nonvolatile semiconductor memory device according to claim 8, wherein
 a certain number of the memory cell units arranged in one direction in the memory cell array form a block, and
 the sense amplifier reads data from a plurality of selected memory cells via all the bit lines in the block.

10. The nonvolatile semiconductor memory device according to claim 8, wherein the sense amplifier is a sense amplifier of a current-detection type that reads data from the selected memory cell while supplying a read current to the selected memory cell via the bit line during a data read operation.

11. The nonvolatile semiconductor memory device according to claim 8, wherein
 in the first and second reading cycles,
 a read pass voltage that makes a memory cell conductive whether the corresponding memory cell is in the first data state or the second data state is applied to each unselected word line in the memory cell array, and
 a read voltage that makes the memory cell conductive when the corresponding memory cell is in the first data state, and makes the memory cell nonconductive when the corresponding memory cell is in the second data state is applied to each selected word line in the memory cell array.

12. The nonvolatile semiconductor memory device according to claim 8, wherein each of the memory cells has a stacked gate structure that has a floating gate electrode and a control gate electrode stacked on a semiconductor substrate via an insulating film.

13. The nonvolatile semiconductor memory device according to claim 8, wherein
 a certain number of the memory cell units arranged in one direction in the memory cell array form a block, and the common source line of each block in the memory cell array is connected to the common source line of the other blocks in the memory cell array.

14. The nonvolatile semiconductor memory device according to claim 8, further comprising a cell source monitoring circuit operative to detect a voltage of the common source line while the data is read from the selected memory cell, compare the detected voltage of the common source line with a reference voltage, and output a read control signal,
wherein the control circuit is configured to determine whether the second reading cycle is to be carried out when data is read from the selected memory cell separated from the common source line driver in the memory cell array by the certain distance or more, based on the read control signal.

15. The nonvolatile semiconductor memory device according to claim 14, further comprising a reference voltage generating circuit operative to generate the reference voltage,
wherein the reference voltage generating circuit may change a magnitude of the reference voltage.

16. A method for operating a nonvolatile semiconductor memory device including a sense amplifier configured to read data from a selected memory cell through at least two cycles including a first reading cycle and a second reading cycle, the second reading cycle being to be carried out after the first reading cycle, the method comprising:
reading, by the sense amplifier, data from a selected memory cell via a bit line connected to one end of a memory cell unit, the memory cell unit including memory cells connected in series, each of the memory cells storing a first data state and a second data state that provides a smaller cell current than the first data state at the time of data reading;
detecting, by a cell source monitoring circuit, a voltage of a common source line commonly connected to other ends of a plurality of memory cell units while data is being read from the selected memory cell;
outputting, by the cell source monitoring circuit, a read control signal after comparing the detected voltage of the common source line with a reference voltage; and
determining, in a control circuit, whether the data read operation of the sense amplifier is to be ended after the first reading cycle is completed, or the second reading cycle is to be carried out, based on the read control signal.

17. The method for operating a nonvolatile semiconductor memory device according to claim 16, wherein reading data by the sense amplifier includes reading data from selected memory cells via all bit lines in a block including a certain number of the memory cell units.

18. The method for operating a nonvolatile semiconductor memory device according to claim 16, wherein reading data in the second reading cycle by the sense amplifier includes stopping supplying a read current to the selected memory cell in the second reading cycle, when the first data state is detected in the selected memory cell in the first reading cycle.

19. The method for operating a nonvolatile semiconductor memory device according to claim 16, wherein reading data by the sense amplifier is performed according to a current-detection type by which data is read while a read current is supplied to the selected memory cell via the bit line in the data read operation.

20. The method for operating a nonvolatile semiconductor memory device according to claim 16, further comprising:
determining, by the control circuit, whether the selected memory cell is separated from a common source line driver in a memory cell array by a certain distance or more,
wherein the control circuit ends the data reading by the sense amplifier after the first reading cycle is completed, when the selected memory cell is located at a position closer to the common source line driver than the certain distance, and
the control circuit controls the data read operation by the sense amplifier based on the read control signal, when the selected memory cell is separated from the common source line driver by the certain distance or more.

* * * * *